(12) United States Patent
Kim

(10) Patent No.: US 8,835,312 B2
(45) Date of Patent: Sep. 16, 2014

(54) METHOD OF MANUFACTURING SEMICONDUCTOR DEVICE

(71) Applicant: Samsung Electronics Co., Ltd., Suwon-si (KR)

(72) Inventor: Ju-Yuon Kim, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 13/720,435

(22) Filed: Dec. 19, 2012

(65) Prior Publication Data

US 2013/0295758 A1 Nov. 7, 2013

(30) Foreign Application Priority Data

May 2, 2012 (KR) ........................ 10-2012-0046358

(51) Int. Cl.
*H01L 21/02* (2006.01)
*H01L 21/4763* (2006.01)
*H01L 21/8238* (2006.01)

(52) U.S. Cl.
CPC *H01L 21/823885* (2013.01); *H01L 21/823842* (2013.01)
USPC ............ 438/653; 438/589; 438/592; 438/635

(58) Field of Classification Search
None
See application file for complete search history.

(56) References Cited

U.S. PATENT DOCUMENTS

| | | | |
|---|---|---|---|
| 6,867,128 B2 * | 3/2005 | Deleonibus | 438/635 |
| 7,176,090 B2 | 2/2007 | Brask et al. | |
| 7,365,015 B2 | 4/2008 | Lin et al. | |
| 8,039,381 B2 | 10/2011 | Yeh et al. | |
| 8,048,792 B2 | 11/2011 | Beyer et al. | |
| 2012/0313178 A1 * | 12/2012 | Liao et al. | 257/368 |

FOREIGN PATENT DOCUMENTS

| | | |
|---|---|---|
| JP | 2005-019892 | 1/2005 |
| JP | 2005-259945 | 9/2005 |
| JP | 2007-134432 | 5/2007 |

* cited by examiner

*Primary Examiner* — Zandra Smith
*Assistant Examiner* — Pamela E Perkins
(74) *Attorney, Agent, or Firm* — F. Chau & Associates, LLC

(57) ABSTRACT

A method of manufacturing a semiconductor device comprises forming an interlayer insulating film on a semiconductor substrate, the interlayer insulating film including a trench, forming a work function metal layer in the trench, forming an insulating film on the work function metal layer, forming a sacrificial film on the insulating film and filling the trench, forming a sacrificial film pattern with a top surface disposed in the trench by etching the sacrificial film, forming an insulating film pattern by selectively etching a portion of the insulating film which is formed higher than the sacrificial film pattern, and forming a work function metal pattern with a top surface disposed in the trench by selectively etching a portion of the work function metal layer which is formed higher than the insulating film pattern.

15 Claims, 16 Drawing Sheets

METHOD OF MANUFACTURING SEMICONDUCTOR DEVICE

This application claims priority from Korean Patent Application No. 10-2012-0046358 filed on May 2, 2012 in the Korean Intellectual Property Office, the disclosure of which is herein incorporated by reference in its entirety.

TECHNICAL FIELD

The present invention relates to a method of manufacturing a semiconductor device.

DISCUSSION OF THE RELATED ART

Metal oxide semiconductor (MOS) transistors have polysilicon gate electrodes. Polysilicon can withstand high temperatures and can block the implantation of doped atoms into a channel region.

However, since polysilicon has a higher resistance than that of most metals, polysilicon gate electrodes may operate at slower speeds than metal gates. A replacement metal gate (RMG) process is a high-temperature process performed while polysilicon is present on a semiconductor substrate. After the high-temperature process, the polysilicon is removed and then replaced by a metal, thereby forming a replacement metal gate electrode.

SUMMARY

Embodiments of the present invention provide a method of manufacturing a semiconductor device with improved metal-fill characteristics.

According to an embodiment of the present invention, there is provided a method of manufacturing a semiconductor device, the method comprising forming an interlayer insulating film on a semiconductor substrate, the interlayer insulating film comprising a trench, forming a work function metal layer in the trench, forming an insulating film on the work function metal layer, forming a sacrificial film on the insulating film, the sacrificial film filling the trench, forming a sacrificial film pattern by etching the sacrificial film, a top surface of the sacrificial film pattern being disposed in the trench, forming an insulating film pattern by selectively etching a portion of the insulating film which is formed higher than the sacrificial film pattern, and forming a work function metal pattern with a top surface disposed in the trench by selectively etching a portion of the work function metal layer which is formed higher than the insulating film pattern.

According to an embodiment of the present invention, there is provided a method of manufacturing a semiconductor device, the method comprising forming an interlayer insulating film on a semiconductor substrate, the interlayer insulating film comprising a first trench having a first width and a second trench having a second width different from the first width, forming a work function metal layer in the first and second trenches, forming an insulating film on the work function metal layer formed in the first and second trenches, forming a sacrificial film on the insulating film and filling the first and second trenches, forming first and second sacrificial film patterns with top surfaces disposed in the first and second trenches, respectively, by etching the sacrificial film, forming a first insulating film pattern by selectively etching a portion of the insulating film which is formed higher than the first sacrificial film pattern and forming a second insulating film pattern by selectively etching a portion of the insulating film which is formed higher than the second sacrificial film pattern, and forming a first work function metal pattern with a top surface disposed in the first trench by selectively etching a portion of the work function metal layer which is formed higher than the first insulating film pattern and forming a second work function metal pattern with a top surface disposed in the second trench by selectively etching a portion of the work function metal layer which is formed higher than the second insulating film pattern, wherein a first depth from a top surface of the interlayer insulating film to the top surface of the first work function metal pattern is different from a second depth from the top surface of the interlayer insulating film to the top surface of the second work function metal pattern.

According to an embodiment of the present invention, there is provided a semiconductor device comprising a semiconductor substrate, an inter-layer insulating film formed on a top surface of the semiconductor substrate, wherein the inter-layer insulating film includes a first trench on a first region of the semiconductor substrate, a first work-function metal pattern formed, in the first trench, on a side surface of the inter-layer insulating film and on the top surface of the semiconductor substrate, wherein an end of the first work-function metal pattern does not extend up to a top surface of the inter-layer insulating film, and a first metal gate structure pattern formed on the first work-function metal pattern in the trench.

BRIEF DESCRIPTION OF THE DRAWINGS

The embodiments of the present invention will become more apparent by the description with reference to the attached drawings, in which.

DETAILED DESCRIPTION OF THE EMBODIMENTS

It will be understood that when an element or layer is referred to as being "on" or "connected to" another element or layer, it can be directly on or connected to the other element or layer or intervening elements or layers may be present. Like numbers may refer to like or similar elements throughout the specification and the drawings. As used herein, the term "and/or" includes any and all combinations of one or more of the associated listed items.

The use of the terms "a" and "an" and "the" and similar referents in the context of describing the invention (especially in the context of the following claims) may be construed to cover both the singular and the plural, unless otherwise indicated herein or clearly contradicted by context.

Figure 1:
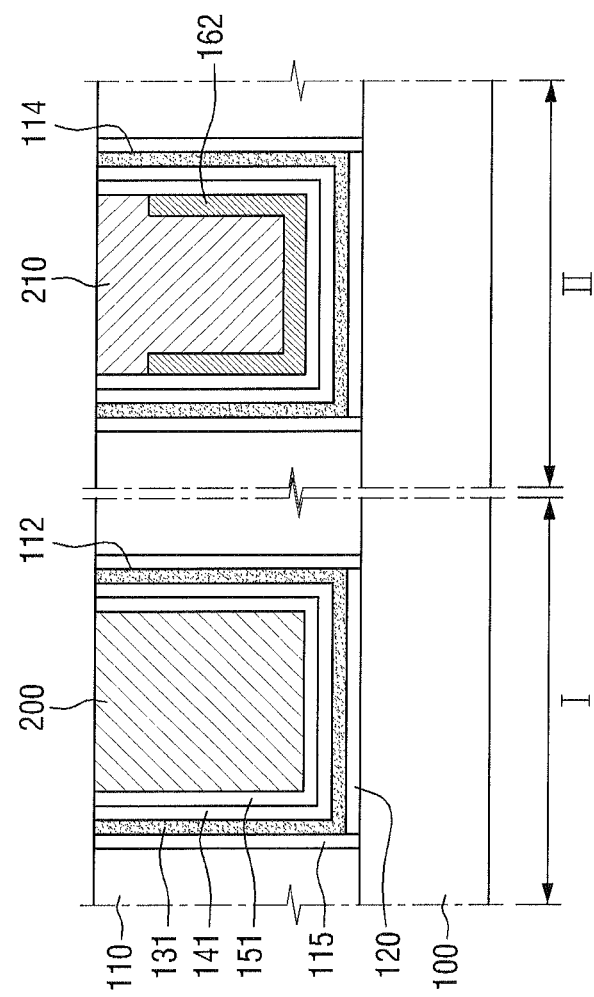
FIG. 1 is a cross-sectional view illustrating a semiconductor device according to an embodiment of the present invention.

FIG. 1 is a cross-sectional view illustrating a semiconductor device according to an embodiment of the present invention.

Referring to FIG. 1, a semiconductor substrate 100 may include a first region I and a second region II. In an embodiment, the first region I may be a region in which an N-type field effect transistor (NFET) is formed, and the second region II may be a region in which a P-type field effect transistor (PFET) is formed.

According to an embodiment, the semiconductor substrate 100 may be a silicon substrate, a gallium arsenide substrate, a silicon germanium substrate, a ceramic substrate, a quartz substrate or a glass substrate for display or may be a semiconductor on insulator (SOI) substrate. However, the embodiments of the present invention are not limited thereto, and various materials that may form the semiconductor substrate 100 can be used.

An interlayer insulating film 110 formed on the semiconductor substrate 100 may include a first trench 112 and a second trench 114. The first trench 112 may be formed on the first region I of the semiconductor substrate 100, and the second trench 114 may be formed on the second region II of the semiconductor substrate 100.

A plurality of functional film patterns that constitute, e.g., an NFET may be formed in the first trench 112. According to an embodiment, the functional film patterns may include an interface film pattern 120, a gate insulating film pattern 131, a first conductive film pattern 141, a second conductive film pattern 151, and a first metal gate structure pattern 200.

The interface film pattern 120 may prevent a poor interface from occurring between the semiconductor substrate 100 and the gate insulating film pattern 131. According to an embodiment, the interface film pattern 120 may include a low-k material layer with a dielectric constant (k) of about 9 or less (e.g., a silicon oxide film with a dielectric constant of about 4) or a silicon oxynitride film with a dielectric constant of about 4 to about 8 according to the content of oxygen atoms and nitrogen atoms. Alternatively, the interface film pattern 110 may be made of silicate or a combination of low-k material layers, e.g., a combination of the silicon oxide film and the silicon oxynitride film.

The gate insulating film pattern 131 may be formed on the interface film pattern 120. According to an embodiment, the gate insulating film pattern 131 may be formed in a 'U' shape along inner sidewalls of the first trench 120 and a top surface of the interface film pattern 120. The gate insulating film pattern 131 according to an embodiment is shaped like "U" when the semiconductor device is formed using a replacement metal gate (RMG) process.

According to an embodiment, the gate insulating film pattern 131 may contain a high-k material. According to an embodiment, the gate insulating film pattern 131 may contain a material of $HfO_2$, $ZrO_2$, $Ta_2O_5$, $TiO_2$, $SrTiO_3$, or $(Ba,Sr)TiO_3$. According to an embodiment, the gate insulating film pattern 131 may be formed to a predetermined thickness according to the type or material of the gate insulating film pattern 131. For example, according to an embodiment, when the gate insulating film pattern 131 is $HfO_2$, the gate insulating film pattern 131 may be formed to a thickness of about 50 Å or less (about 5 Å to about 50 Å).

The first conductive film pattern 141 and the second conductive film pattern 151 may be formed on the gate insulating film pattern 131. In an embodiment, the first conductive film pattern 141 and the second conductive film pattern 151 may be formed in a U' shape. In an embodiment, each of the first conductive film pattern 141 and the second conductive film pattern 151 may include, for example, a metal nitride film. According to an embodiment, the first conductive film pattern 141 may include a TiN film, and the second conductive film pattern 151 may include a TaN film. However, the embodiments of the present invention are not limited thereto.

Each of the first conductive film pattern 141 and the second conductive film pattern 151 may be formed to a predetermined thickness according to the type or material thereof. For example, according to an embodiment, when the first conductive film pattern 141 includes TiN, the first conductive film pattern 141 may be formed to a thickness of about 5 Å to about 40 Å. According to an embodiment, when the second conductive film pattern 151 includes TaN, the second conductive film pattern 151 may be formed to a thickness of about 5 Å to about 30 Å.

The first metal gate structure pattern 200 may be formed on the second conductive film pattern 151. The first metal gate structure pattern 200 may fill the first trench 112 on the second conductive film pattern 151. According to an embodiment, the first metal gate structure pattern 200 may include an N-type work function metal pattern for improving a work function of the NFET and a metal gate pattern. Examples of the N-type work function metal may include, but are not limited to, TiAl, TiAlN, TaC, TiC, and HfSi. Examples of the metal gate may include, but are not limited to, Al and W.

A plurality of functional film patterns that constitute, e.g., a PFET may be formed in the second trench 114. According to an embodiment, the functional film patterns may include an interface film pattern 120, a gate insulating film pattern 131, a first conductive film pattern 141, a second conductive film pattern 151, a work function metal pattern 162, and a second metal gate structure pattern 210.

According to an embodiment, the interface film pattern 120, the gate insulating film pattern 131, and the first and second conductive film patterns 141 and 151 formed in the second trench 114, respectively, are identical or substantially identical to the interface film pattern 120, the gate insulating film pattern 131, and the first and second conductive film patterns 141 and 151 formed in the first trench 112.

The work function metal pattern 162 may be formed on the second conductive film pattern 151. According to an embodiment, the work function metal pattern 162 may be formed in a 'U' shape on the second conductive film pattern 151.

In an embodiment, a topmost surface of the work function metal pattern 162 (e.g., two ends of the work function metal pattern 162 formed in a 'U' shape) may not extend up to a top surface of the second trench 114 and may be located within the second trench 114. The shape of the work function metal pattern 162 can improve metal-fill characteristics of the second metal gate structure pattern 210 formed on the work function metal pattern 162.

As the size of the semiconductor device decreases, the width of the first and second trenches 112 and 114 decreases. When the two ends of the work function metal pattern 162 extend up to the top surface of the second trench 114 unlike what is illustrated in FIG. 1, the entrance of the second trench 114 becomes narrow, which may result in a deterioration of metal-fill characteristics of the second metal gate structure pattern 210 to be filled in the second trench 114 in a subsequent process. Accordingly, in an embodiment, the topmost surface (e.g., the two ends) of the work function metal pattern 162 is not extended to the top surface of the second trench 114. As a result, the entrance region of the second trench 114 is wide enough to allow the second metal gate structure pattern 210 to be reliably formed in a subsequent process.

In an embodiment, the work function metal pattern 162 may be a P-type work function metal pattern to improve a work function of, e.g., a PFET. In some embodiments of the present invention, the work function metal pattern 162 may be, e.g., a metal nitride film. According to an embodiment, the work function metal pattern 162 may be, but is not limited to, a TiN film.

The second metal gate structure pattern 210 may be formed on the work function metal pattern 162. The second metal gate structure pattern 210 may fill the second trench 114 on the work function metal pattern 162. According to an embodiment, the second metal gate structure pattern 210 may include an additional P-type work function metal pattern for improving the work function of the PFET and a metal gate pattern.

A spacer 115 made of an insulating film may be formed on two opposite sides of each of the first trench 112 and the second trench 114. Although in FIG. 1 the spacer 115 has a pillar shape, the shape of the spacer 115 is not limited thereto. In an embodiment of the present invention, the spacer 115 may be shaped like "L".

Hereinafter, a method of manufacturing a semiconductor device according to an embodiment of the present invention is described with reference to FIGS. 1 through 9.

FIGS. 2 through 9 are cross-sectional views illustrating intermediate processes included in a method of manufacturing a semiconductor device according to an embodiment of the present invention.

Figure 2:
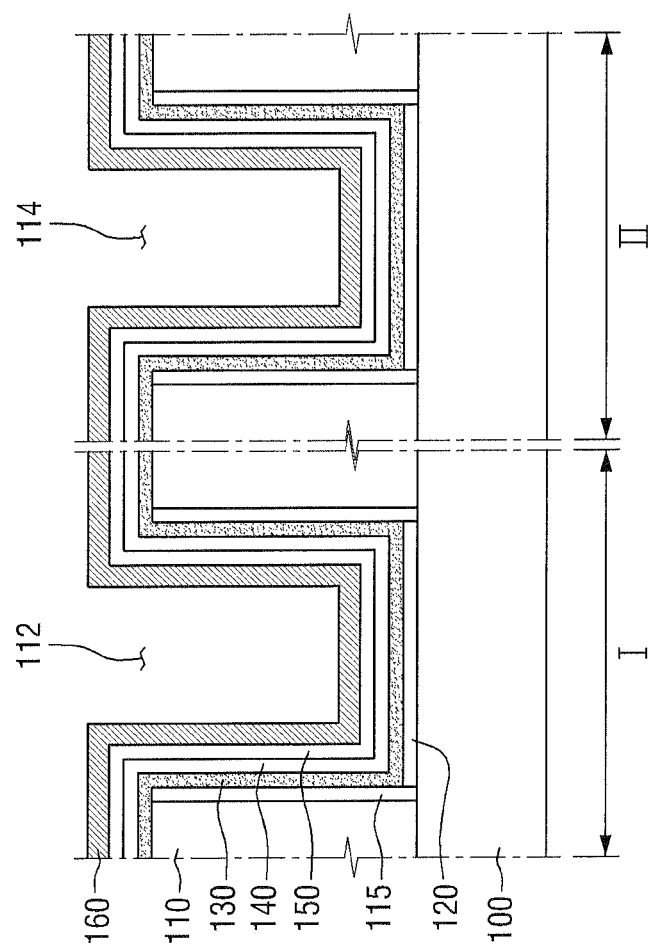
FIGS. 2 through 9 are cross-sectional views illustrating intermediate processes included in a method of manufacturing a semiconductor device according to an embodiment of the present invention.

Referring to FIG. 2, an interlayer insulating film 110 including a first trench 112 is formed on a first region I of a semiconductor substrate 100, and the interlayer insulating film 110 including a second trench 114 is formed on a second region II of the semiconductor substrate 100.

According to an embodiment, each of the first and second trenches 112 and 114 of the interlayer insulating film 110 may be formed by an RMG (Replacement Metal Gate) process.

A dummy gate structure is formed on each of the first and second regions I and II of the semiconductor substrate 100. A spacer 115 is formed on two opposite sides of the dummy gate structure. An interlayer insulating film 110 is formed on the semiconductor substrate 100 and covers the dummy gate structure. The interlayer insulating film 110 is planarized until a top surface of the dummy gate structure formed on each of the first and second regions I and II is exposed. A first trench 112 is formed by removing the dummy gate structure having the exposed top surface on the first region I, and a second trench 114 is formed by removing the dummy gate structure having the exposed top surface on the second region II.

After the first and second trenches 112 and 114 are formed, an interface film pattern 120 is formed on an exposed surface of the semiconductor substrate 100 by, e.g., a thermal oxidation process. According to an embodiment, the interface film pattern 120 may be made of a low-k material layer with a dielectric constant (k) of about 9 or less. The interface film pattern 120 can prevent a poor interface from occurring between the semiconductor substrate 100 and a gate insulating film pattern 131.

A gate insulating film 130, a first conductive film 140, and a second conductive film 150 are sequentially formed on the interface film pattern 120 in each of the first and second trenches 112 and 114. According to an embodiment, the gate insulating film 130, the first conductive film 140 and the second conductive film 150 may be formed by atomic layer deposition (ALD), chemical vapor deposition (CVD), plasma enhanced chemical vapor deposition (PECVD), or physical vapor deposition (PVD). The gate insulating film 130, the first conductive film 140, and the second conductive film 150 may be conformally formed along a top surface of the interlayer insulating film 110, side surfaces of the first and second trenches 112 and 114, and a top surface of the interface film pattern 120.

According to an embodiment, the gate insulating film 130 may contain a high-k material, for example, a material of $HfO_2$, $ZrO_2$, $Ta_2O_5$, $TiO_2$, $SrTiO_3$, or $(Ba,Sr)TiO_3$. According to an embodiment, the first conductive film 140 and the second conductive film 150 may include metal nitride films, for example, a TiN film and a TaN film, respectively.

A work function metal layer 160 is formed on the second conductive film 150 in each of the first and second trenches 112 and 114. In an embodiment, the work function metal layer 160 may include a P-type work function metal for improving a work function of, e.g., a PFET. According to an embodiment, the work function metal layer 160 may include, but is not limited to, TiN.

In an embodiment of the present invention, the work function metal layer 160 may be thicker than the first conductive film 140. In an embodiment of the present invention, the work function metal layer 160 may be thicker than the first and second conductive films 140 and 150.

Figure 3:
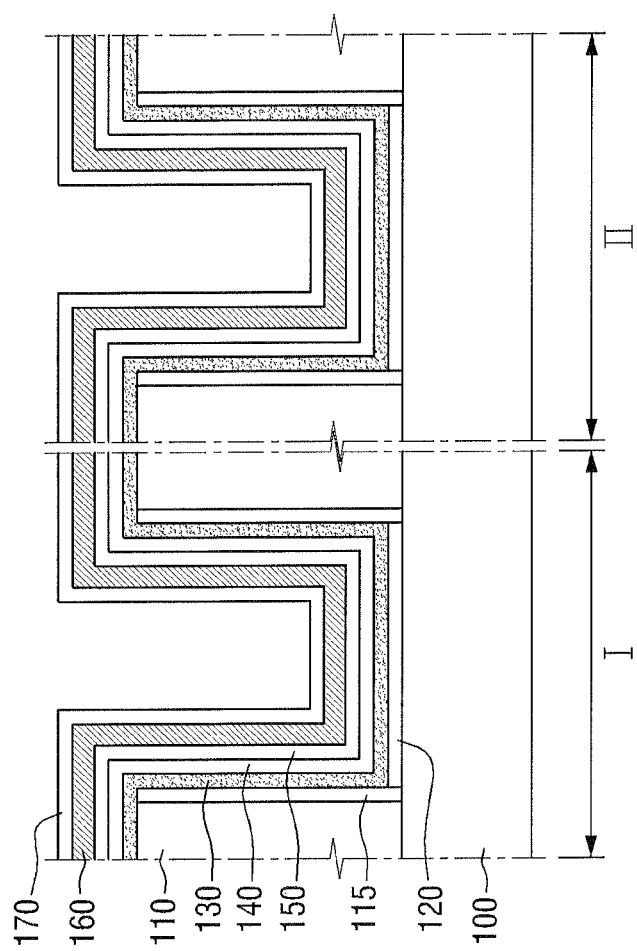

Referring to FIG. 3, an insulating film 170 is formed on the work function metal layer 160. According to an embodiment, the insulating film 170 may be formed on the work function metal layer 160 by atomic layer deposition (ALD), chemical vapor deposition (CVD), plasma enhanced chemical vapor deposition (PECVD), or physical vapor deposition (PVD). As shown in FIG. 3, the insulating film 170 may be conformally formed along the work function metal layer 160.

In an embodiment, the insulating film 170 may be, for example, an oxide film. According to an embodiment, the insulating film 170 may be an oxide film having an etch selectivity with respect to the work function metal layer 160. According to an embodiment, the insulating film 170 may be an oxide film having an etch selectivity with respect to the work function metal layer 160 and a sacrificial film 180.

Figure 4:
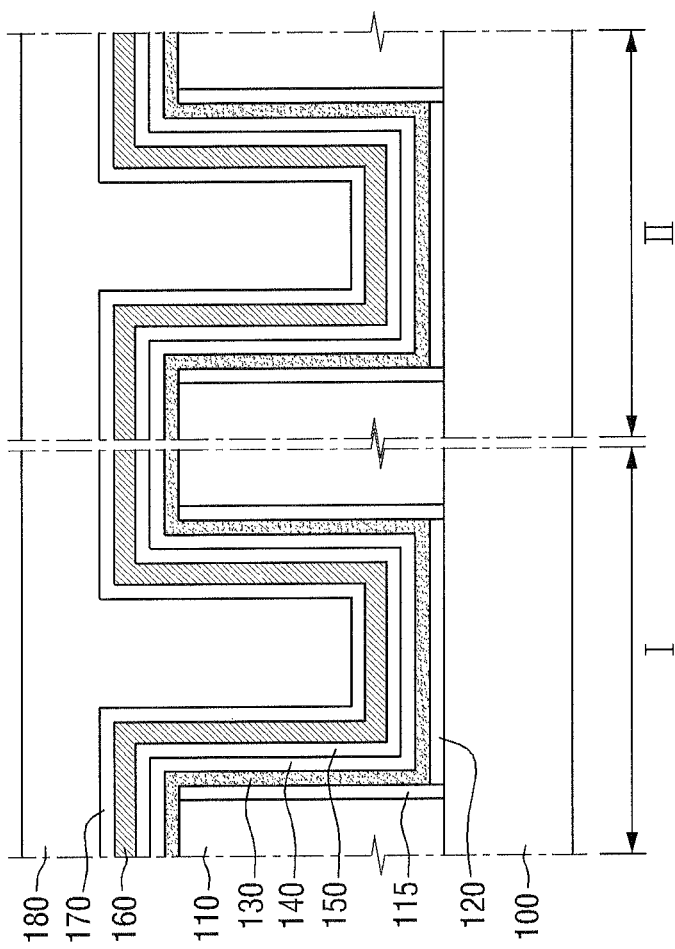

Referring to FIG. 4, the sacrificial film 180 is formed on the insulating film 170. The sacrificial film 180 may fill the first and second trenches 112 and 114. In an embodiment, the sacrificial film 180 may include an organic material. In an embodiment of the present invention, the sacrificial film 180 may include, but is not limited to, photoresist.

Figure 5:
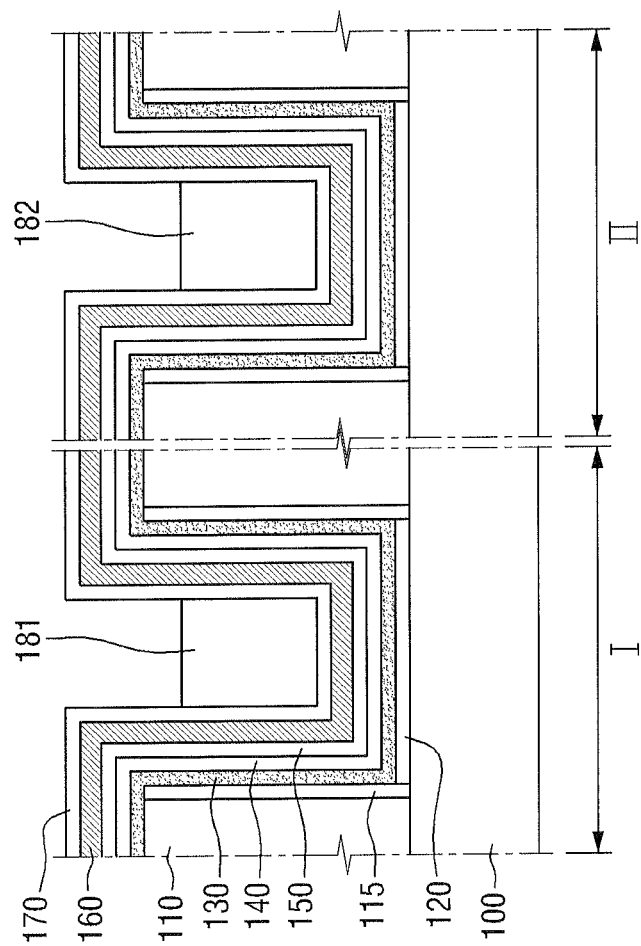

Referring to FIG. 5, the sacrificial film 180 is etched, forming a first sacrificial film pattern 181 with a top surface disposed within the first trench 112 and a second sacrificial film pattern 182 with a top surface disposed within the second trench 114.

According to an embodiment, the sacrificial film 180 is etched until the insulating film 170 formed under the sacrificial film 180 is exposed. A top surface of the etched sacrificial film 180 may have the same or substantially the same height as a top surface of the insulating film 170. The etched sacrificial film 180 is etched again for a predetermined period of time, forming the first sacrificial film pattern 181 and the second sacrificial film pattern 182 respectively having top surfaces disposed in the first trench 112 and the second trench 114, respectively. According to an embodiment, the sacrificial film 180 is etched twice to thereby form the first and second sacrificial film patterns 181 and 182. Alternatively, the sacrificial film 180 may be etched once to thereby form the first and second sacrificial film patterns 181 and 182.

Figure 6:
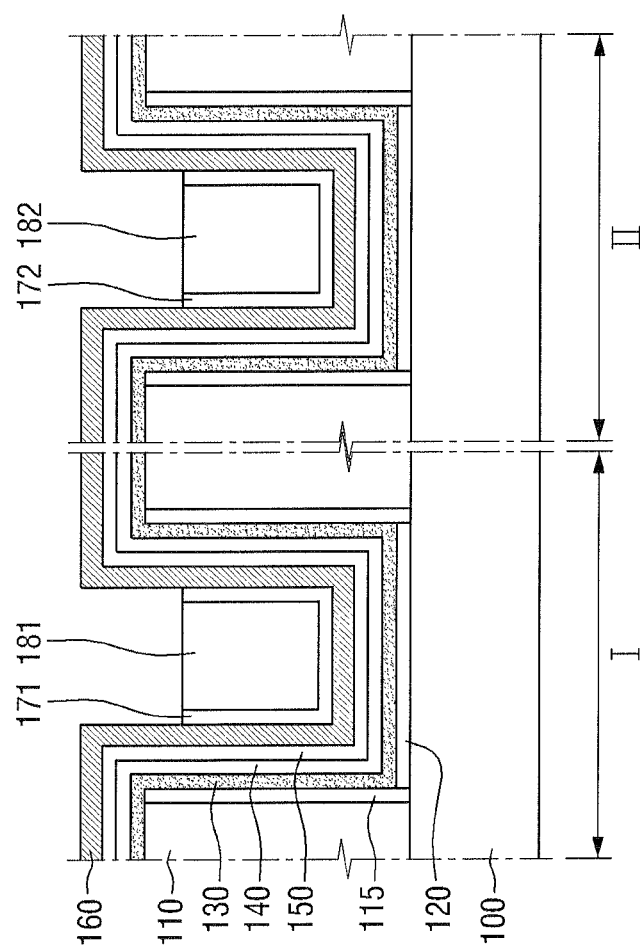

Referring to FIG. 6, the insulating film 170 formed higher than the first and second sacrificial film patterns 181 and 182 is selectively etched forming first and second insulating film patterns 171 and 172 in the first and second trenches 112 and 114, respectively. A portion of the insulating film 170 which is formed higher than the first sacrificial film pattern 181 is etched using the etch selectivity of the sacrificial film 170 with respect to the work function metal layer 160 and the first sacrificial film pattern 181, thereby forming the first insulating film pattern 171. A portion of the insulating film 170 (see FIG. 5) which is formed higher than the second sacrificial film pattern 182 is etched using the etch selectivity of the insulating film 170 with respect to the work function metal layer 160 and the second sacrificial film pattern 182, thereby forming the second insulating film pattern 172. According to an embodiment, topmost surfaces (e.g., two ends) of the first and second insulating film patterns 171 and 172 may be located at the same or substantially the same height as top surfaces of the first and second sacrificial film patterns 181 and 182, respectively, as shown in FIG. 6.

Figure 7:
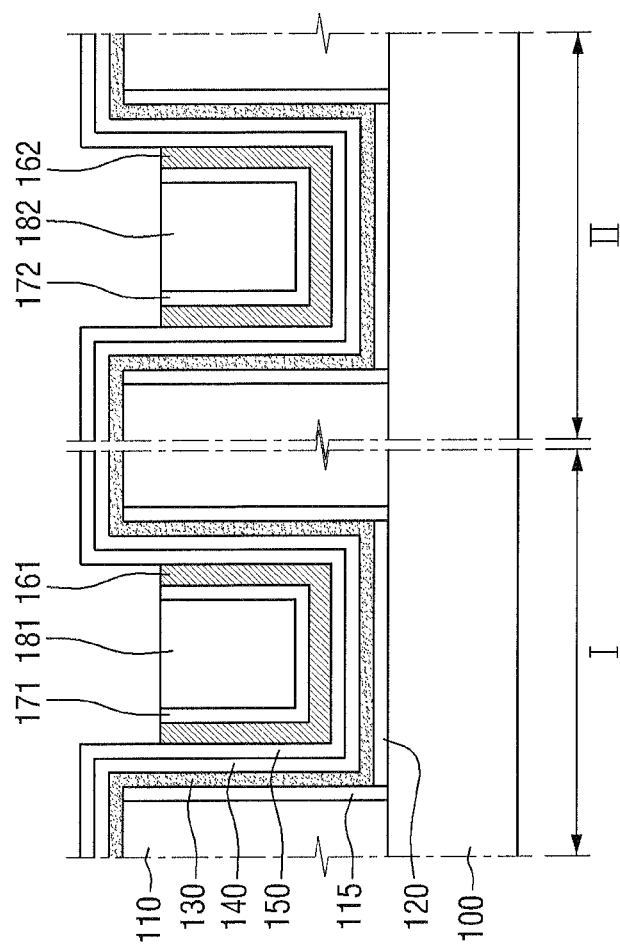

Referring to FIG. 7, the work function metal layer 160 formed higher than the first and second insulating film patterns 171 and 172 is selectively etched, thereby forming first and second work function metal patterns 161 and 162 respectively having topmost surfaces disposed in the first and second trenches 112 and 114, respectively. A portion of the work function metal layer 160 which is formed higher than the first insulating film pattern 171 is etched using the etch selectivity of the work function metal layer 160 with respect to the second conductive film 150, the first insulating film pattern 171 and the first sacrificial film pattern 181, thereby forming the first work function metal pattern 161. A portion of the work function metal layer 160 which is formed higher than the second insulating film pattern 172 is etched using the etch selectivity of the work function metal layer 160 with respect to the second conductive film 150, the second insulating film pattern 172 and the second sacrificial film pattern 182, thereby forming the second work function metal pattern 162. As shown in FIG. 7, a topmost surface (e.g., two ends) of the first work function metal pattern 161 may be located at the same or substantially the same height as the topmost surface (e.g., two ends) of the first insulating film pattern 171 and the top surface of the first sacrificial film pattern 181, and a topmost surface (e.g., two ends) of the second work function metal pattern 162 may be located at the same or substantially the same height as the topmost surface (e.g., two ends) of the second insulating film pattern 172 and the top surface of the second sacrificial film pattern 182.

Figure 8:
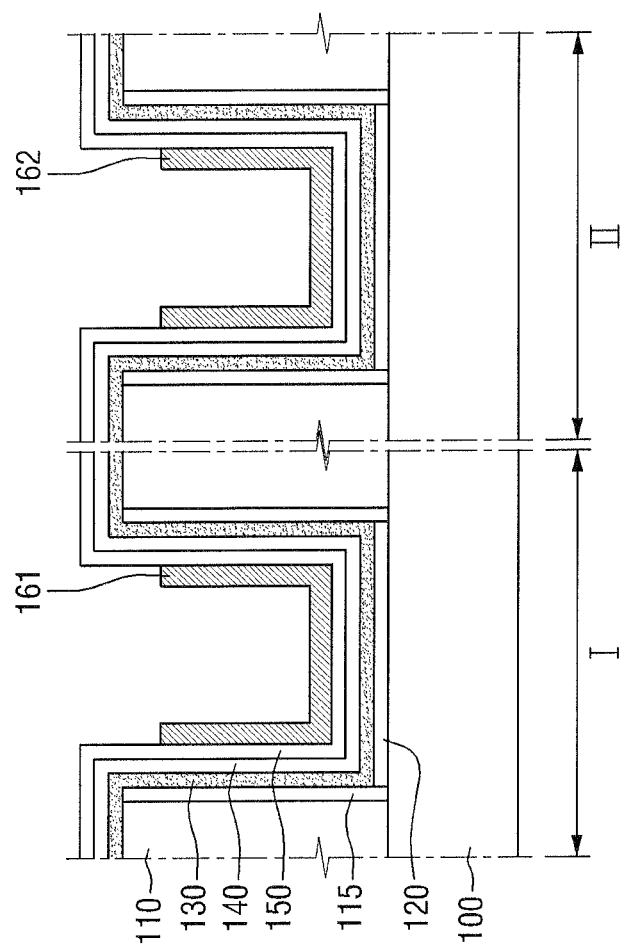

Referring to FIG. 8, the first and second insulating film patterns 171 and 172 respectively formed on the first and second work function metal patterns 161 and 162 and the first and second sacrificial film patterns 181 and 182 are removed. The first and second sacrificial film patterns 181 and 182 are etched using their etch selectivity with respect to the second conductive film 150. According to an embodiment, the first and second sacrificial film patterns 181 and 182 are etched using the first and second insulating film patterns 171 and 172 as etch stop films, respectively. Accordingly, the first and second sacrificial film patterns 181 and 182 are removed, and the first and second insulating film patterns 171 and 172 are exposed. The first and second insulating film patterns 171 and 172 are etched using their etch selectivity with respect to the second conductive film 150. According to an embodiment, the first and second insulating film patterns 171 and 172 are etched using the first and second work function metal patterns 161 and 162 as etch stop films, respectively. Accordingly, the first and second insulating film patterns 171 and 172 are removed, and the first and second work function metal patterns 161 and 162 remain in the first and second trenches 112 and 114, respectively.

Figure 9:
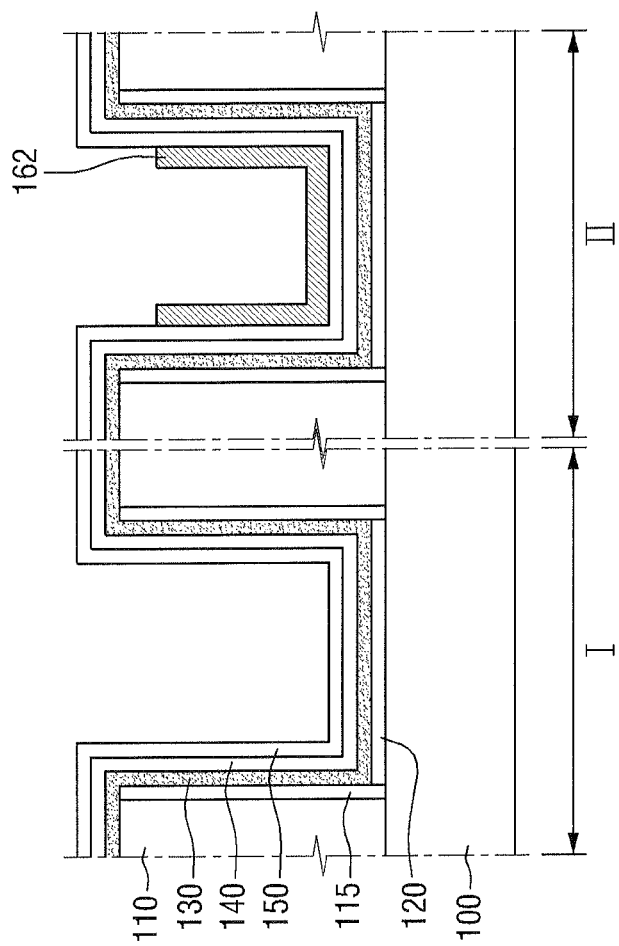

Referring to FIG. 9, the first work function metal pattern 161 formed in the first trench 112 is removed. In an embodiment, the removed first work function metal pattern 161 is a P-type work function metal pattern. According to an embodiment, the removal process can be modified or omitted depending on the characteristics of the work function metal pattern 161.

Referring back to FIG. 1, a first metal gate structure is formed in the first trench 112, and a second metal gate structure is formed on the second work function metal pattern 162 in the second trench 114. The first and second metal gate structures are planarized until the interlayer insulating film 110 is exposed, thereby forming a gate insulating film pattern 131, first and second conductive film patterns 141 and 151, and first and second metal gate structure patterns 200 and 210.

A semiconductor device according to an embodiment of the present invention is described with reference to FIG. 10.

Figure 10:
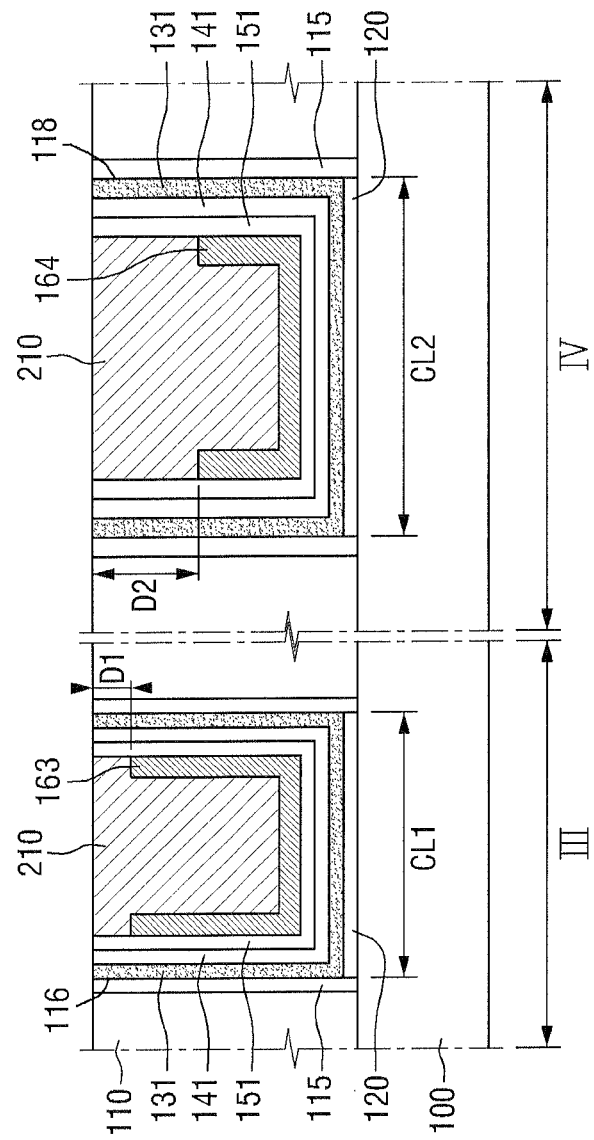
FIG. 10 is a cross-sectional view illustrating a semiconductor device according to an embodiment of the present invention.

FIG. 10 is a cross-sectional view illustrating a semiconductor device according to an embodiment of the present invention.

Referring to FIG. 10, an interlayer insulating film 110 may include a third trench 116 which is formed on a third region III of a semiconductor substrate 100 and which has a first width CL1 and a fourth trench 118 which is formed on a fourth region IV of the semiconductor substrate 100 and which has a second width CL2. According to an embodiment, each of the first width CL1 and the second width CL2 may be equal or substantially equal to a channel length of a transistor. According to an embodiment, the first width CL1 and the second width CL2 may be different from each other. According to an embodiment of the present invention, the first width CL1 may be smaller than the second width CL2 as shown in FIG. 10.

According to an embodiment, a PFET may be formed on each of the third region III and the fourth region IV of the semiconductor substrate 100. The PFET formed on each of the third and fourth regions III and IV may include a third or fourth work function metal pattern 163 or 164. According to an embodiment, two ends of each of the third and fourth work function metal patterns 163 and 164 are lower in height than top surfaces of the third and fourth trenches 116 and 118. According to an embodiment, a first depth D1 from a top surface of the interlayer insulating film 110 (e.g., a top surface of the third trench 116) to a topmost surface (e.g., two ends) of the third work function metal pattern 163 may be different from a second depth D2 from the top surface of the interlayer insulating film 100 (e.g., a top surface of the fourth trench 118) to a topmost surface (e.g., two ends) of the fourth work function metal pattern 164. According to an embodiment, when the first width CL1 is smaller than the second width CL2 as shown in FIG. 10, the first depth D1 may be smaller than the second depth D2. According to an embodiment, the difference between the first depth D1 and the second depth D2 may arise since the degree of etch of a work function metal layer 160 (e.g., as shown in FIG. 11) may vary according to the channel length of a transistor formed by a method of manufacturing a semiconductor device according to an embodiment of the present invention.

A method of manufacturing a semiconductor device according to an embodiment of the present invention is described with reference to FIGS. 4, and 10 through 13.

Figure 11:
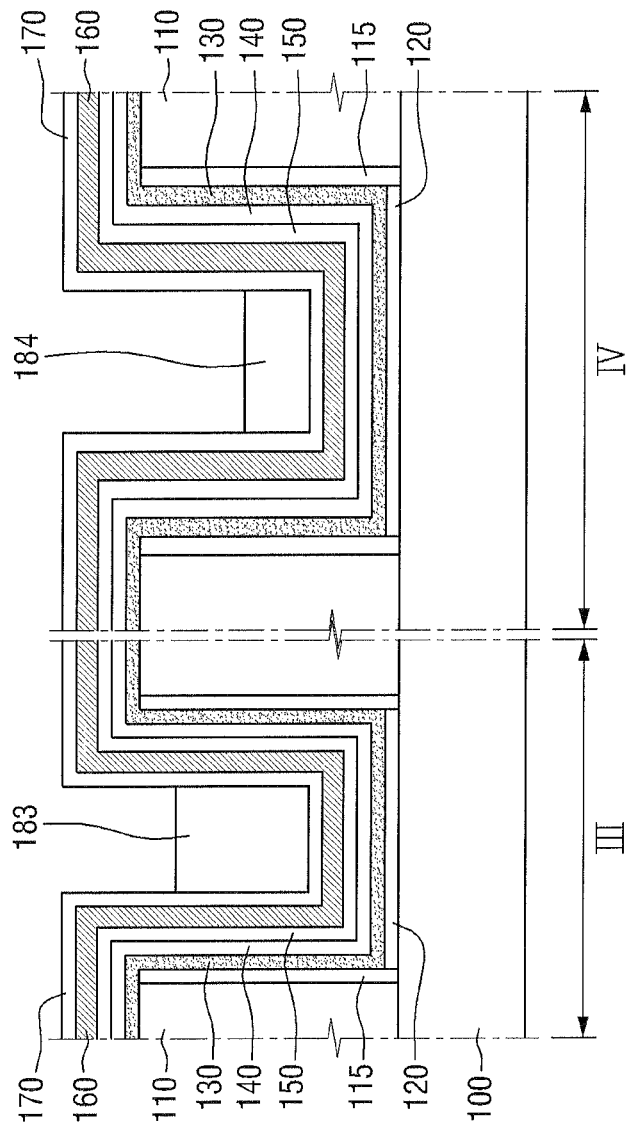
FIGS. 11 through 13 are cross-sectional views illustrating intermediate processes included in a method of manufacturing a semiconductor device according to an embodiment of the present invention.
Figure 12:
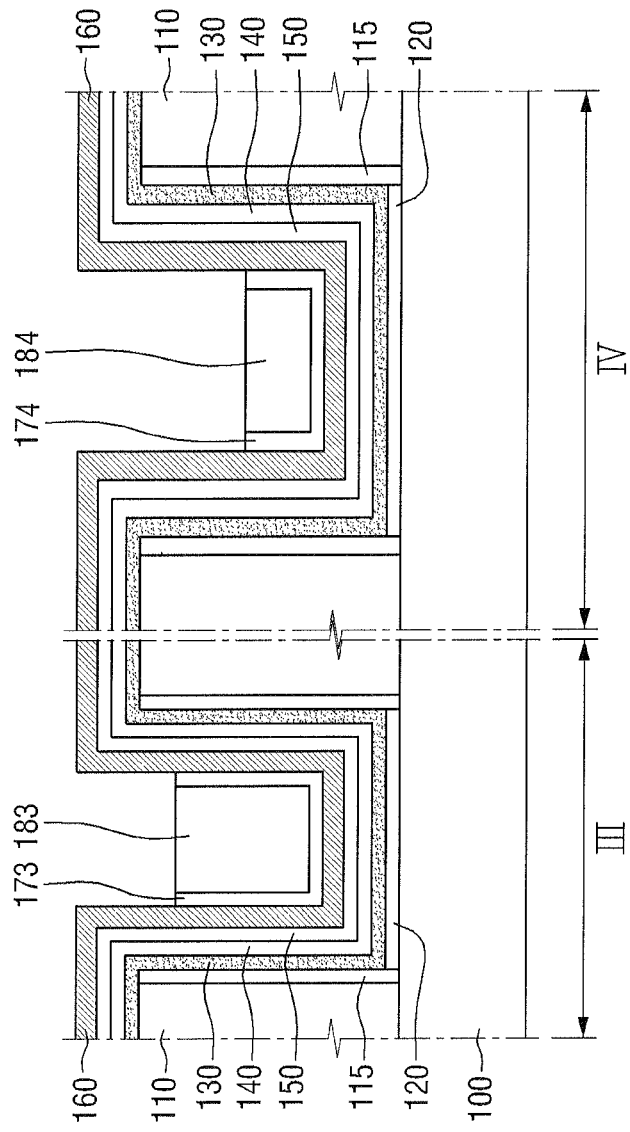
Figure 13:
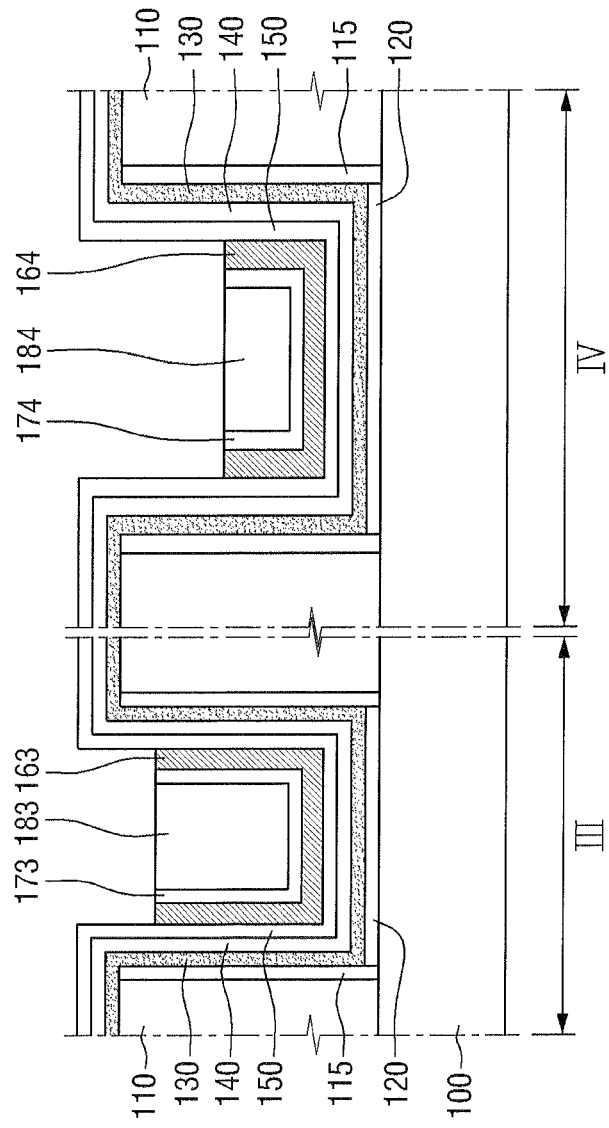

FIGS. 11 through 13 are cross-sectional views illustrating intermediate processes included in a method of manufacturing a semiconductor device according to an embodiment of the present invention.

Referring to FIG. 11, an interlayer insulating film 110 formed on a semiconductor substrate 100 is prepared. The interlayer insulating film 110 includes a third trench 116 having a first width CL1 and a fourth trench 118 having a second width CL2 which is greater than the first width CL1.

A spacer 115 made of an insulating material may be placed on two opposite sides of each of the third trench 116 and the fourth trench 118. An interface film pattern 120, a gate insulating film 130, a first conductive film 140, a second conductive film 150, a work function metal layer 160, an insulating film 170, and a sacrificial film 180 are sequentially formed in each of the third and fourth trenches 116 and 118. According to an embodiment, the preparation or formation of the inter-layer insulating film 110, the trenches 116 and 118, the spacer 115, the interface film pattern 1120, the gate insulating film 130, the first conductive film 140, the second conductive film 150, the work function metal layer 160, the insulating film 170, and the sacrificial film 180 may be performed by the same or substantially the same processes described in connection with FIGS. 1 to 9.

The sacrificial film 180 is etched, thereby forming a third sacrificial film pattern 183 with a top surface disposed in the third trench 116 and a fourth sacrificial film pattern 184 with a top surface disposed in the fourth trench 118.

The sacrificial film 180 formed in the fourth trench 118 has a wider cross-sectional area which contacts an etchant than the sacrificial film 180 formed in the third trench 116. Therefore, even when the sacrificial film 180 formed in the fourth trench 118 and the sacrificial film 180 formed in the third trench 116 are etched for the same period of time, the sacrificial film 180 formed in the fourth trench 118 may be etched more. Accordingly, the fourth sacrificial film pattern 184 formed in the fourth trench 118 may be lower in height than the third sacrificial film pattern 183 formed in the third trench 116 as shown in FIG. 11.

Referring to FIG. 12, the insulating film 170 formed higher than the third and fourth sacrificial film patterns 183 and 184 is selectively etched forming third and fourth insulating film patterns 173 and 174 in the third and fourth trenches 116 and 118, respectively. Since the fourth sacrificial film pattern 184 is lower than the third sacrificial film pattern 183, a topmost surface (e.g., two ends) of the fourth insulating film pattern 174 may be formed lower than a topmost surface (e.g., two ends) of the third insulating film pattern 173.

Referring to FIG. 13, the work function metal layer 160 formed higher than the third and fourth insulating film patterns 173 and 174 is selectively etched, thereby forming a third work function metal pattern 163 with a top surface disposed in the third trench 116 and a fourth work function metal pattern 164 with a top surface disposed in the fourth trench 118. Since the fourth sacrificial film pattern 184 and the fourth insulating film pattern 174 are lower in height than the third sacrificial film pattern 183 and the third insulating film pattern 173, a topmost surface (e.g., two ends) of the fourth work function metal pattern 164 may be formed lower than a topmost surface (e.g., two ends) of the third work function metal pattern 163.

Referring to FIG. 10, a metal gate structure pattern 210 is formed in each of the third trench 116 and the fourth trench 118 and fills each of the third trench 116 and the fourth trench 118.

Hereinafter, a semiconductor device according to an embodiment of the present invention is described with reference to FIG. 14.

Figure 14:
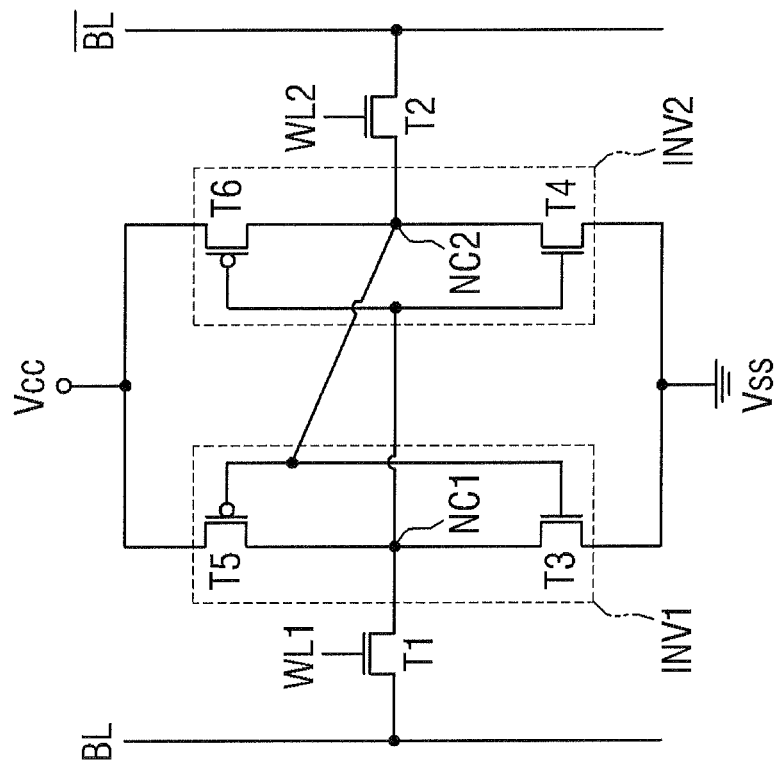
FIG. 14 is a circuit diagram illustrating a semiconductor device according to an embodiment of the present invention.

FIG. 14 is a circuit diagram illustrating a semiconductor device according to an embodiment of the present invention. According to an embodiment, a static random access memory (SRAM) is described below as an example of a semiconductor device. However, the embodiments of the present invention is not limited to the SRAM.

Referring to FIG. 14, the semiconductor device may include two inverters, e.g., first and second inverters INV1 and INV2 connected in parallel between a power node Vcc and a ground node Vss and first and second transmission transistors T1 and T2 which are connected to output nodes NC1 and NC2 of the first and second inverters INV and INV2, respectively. The first transmission transistor T1 and the second transmission transistor T2 may be connected to a bit line BL and a complementary bit line BL/, respectively. A gate of the first transmission transistor T1 and a gate of the second transmission transistor T2 may be connected to word lines WL1 and WL2, respectively.

The first inverter INV1 may include a first load transistor T5 and a first driving transistor T3 connected in series to each other, and the second inverter INV2 may include a second load transistor T6 and a second driving transistor T4 connected in series to each other. An input node of the first inverter INV1 may be connected to the output node NC2 of the second inverter INV2, and an input node of the second inverter INV2 may be connected to the output node NC1 of the first inverter INV1, and thus, the first inverter INV1 and the second inverter INV2 may form one latch circuit.

According to an embodiment, at least one of the first load transistor T5 and the second load transistor T6 may be a PFET (P-type Field Effect Transistor) according to an embodiment of the present invention, and at least one of the first transmission transistor T1, the second transmission transistor T2, the first driving transistor T3 and the second driving transistor T4 may be an NFET (N-type Field Effect Transistor) according to an embodiment of the present invention.

Hereinafter, a semiconductor device according to an embodiment of the present invention is described with reference to FIG. 15.

Figure 15:
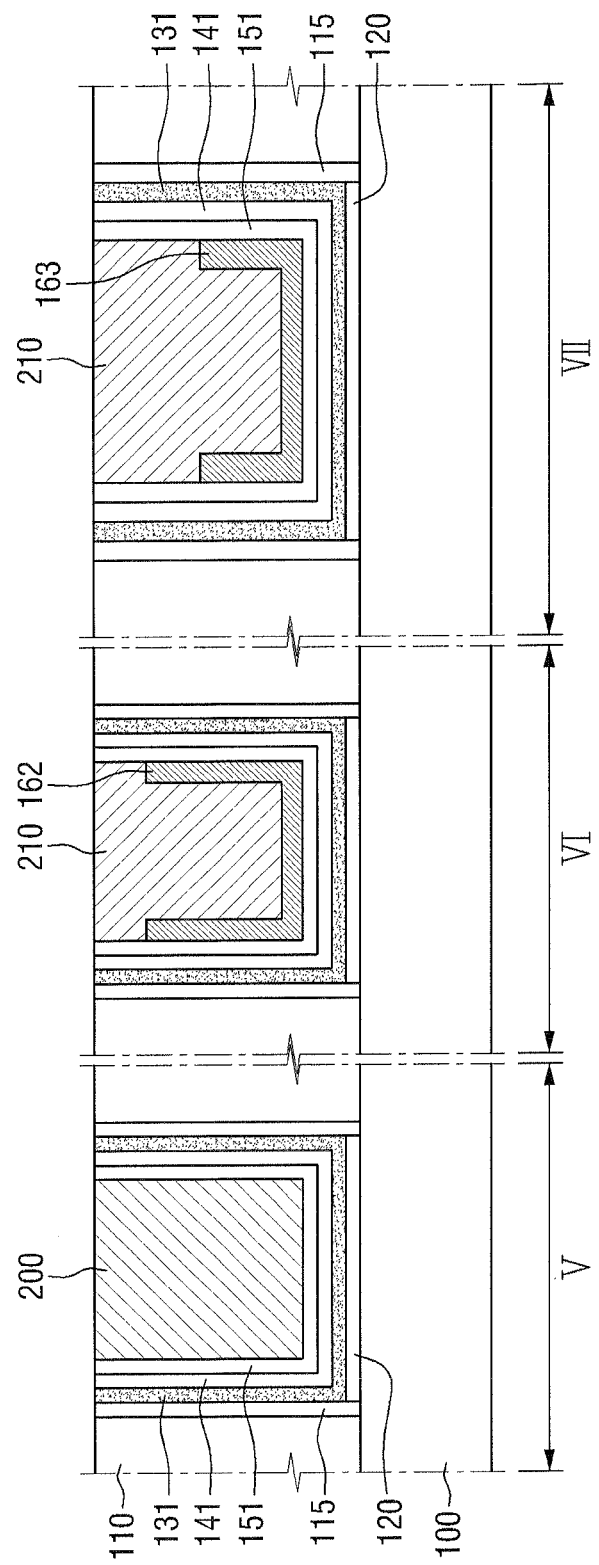
FIG. 15 is a cross-sectional view illustrating a semiconductor device according to an embodiment of the present invention.

FIG. 15 is a cross-sectional view illustrating a semiconductor device according to an embodiment of the present invention.

Referring to FIG. 15, a semiconductor substrate 100 of the semiconductor device may include a fifth region V, a sixth region VI, and a seventh region VII. According to an embodiment, the fifth region V and the sixth region VI may be memory regions in which, e.g., the SRAM described above in connection with FIG. 14 is formed, and the seventh region VII may be a peripheral circuit region. The peripheral circuit region may include an input/output (I/O) region. The seventh region VII may have a lower density and a wider gap between elements than the fifth region V and the sixth region VI.

According to an embodiment, an NFET (N-type Field Effect Transistor) and a PFET (P-type Field Effect Transistor) may be formed in the fifth region V and the sixth region VI, respectively. In the seventh region VII, a PFET (P-type Field Effect Transistor) having a greater channel length than a channel length of the PFET formed in the sixth region VI may be formed in the form of a logic element.

Hereinafter, an electronic system to which a semiconductor device according to an embodiment of the present invention is applied is described with reference to FIG. 16.

Figure 16:
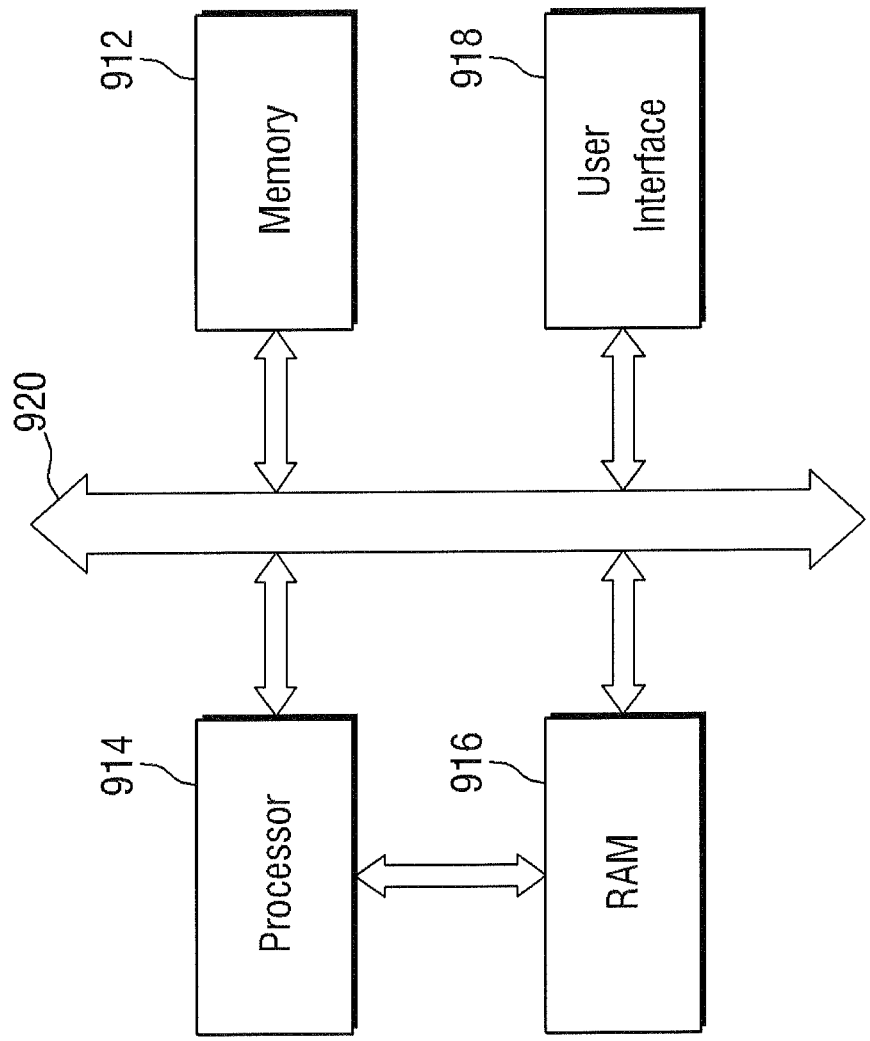
FIG. 16 is a block diagram illustrating an electronic system to which a semiconductor device according to the embodiments of the present invention is applied.

FIG. 16 is a block diagram illustrating an electronic system 900 to which a semiconductor device according to an embodiment of the present invention is applied.

Referring to FIG. 16, the electronic system 900 may include a memory system 912, a processor 914, a random access memory (RAM) 916, and a user interface 918. According to an embodiment, examples of the electronic system 900 may include a mobile device and a computer.

The memory system 912, the processor 914, the RAM 916, and the user interface 918 may perform data communication with each other using a bus 920. The processor 914 may execute programs and may control the electronic system 900. The RAM 916 can be used as an operation memory of the processor 914.

At least one of the processor 914, the RAM 916, and/or the memory system 912 may include a semiconductor device according to an embodiment of the present invention. In an embodiment of the present invention, the processor 914 and the RAM 916 may be included in one package.

The user interface 918 may be used to input or output data to/from the electronic system 900. The memory system 912 may store codes for operating the processor 914, data processed by the processor 914, or data input from an external source. The memory system 912 may include a controller and a memory.

In concluding the detailed description, those skilled in the art will appreciate that many variations and modifications can be made to the embodiments without substantially departing from the principles of the present invention. Therefore, the disclosed embodiments of the invention are used in a generic and descriptive sense only and not for purposes of limitation.

What is claimed is:

1. A method of manufacturing a semiconductor device, the method comprising:
   forming an interlayer insulating film on a semiconductor substrate, wherein the interlayer insulating film comprises a trench;
   forming a work function metal layer in the trench;
   forming an insulating film on the work function metal layer;
   forming a sacrificial film on the insulating film, wherein the sacrificial film fills the trench;
   forming a sacrificial film pattern disposed in the trench by etching the sacrificial film;
   forming an insulating film pattern by selectively etching a portion of the insulating film which is formed higher than the sacrificial film pattern; and
   forming a work function metal pattern disposed in the trench by selectively etching a portion of the work function metal which is formed higher than the insulating film pattern.

2. The method of claim 1, wherein etching the sacrificial film comprises:
   etching the sacrificial film until the insulating film is exposed; and
   etching the etched sacrificial film for a predetermined period of time.

3. The method of claim 2, wherein the insulating film comprises an oxide film, and the sacrificial film comprises an organic film.

4. The method of claim 1, wherein forming the interlayer insulating film comprises sequentially forming a gate insulating film and a conductive film in the trench, and forming the work function metal layer in the trench comprises forming the work function metal layer on the conductive film.

5. The method of claim 4, wherein selectively etching the portion of the work function metal layer comprises selectively etching the portion of the work function metal layer by using an etch selectivity of the work function metal layer with respect to the conductive film, the insulating film pattern, and the sacrificial film pattern.

6. The method of claim 5, wherein the work function metal layer comprises TiN, and the conductive film comprises TaN.

7. The method of claim 1, wherein selectively etching the portion of the insulating film comprises selectively etching the portion of the insulating film by using an etch selectivity of the insulating film with respect to the work function metal layer and the sacrificial film pattern.

8. The method of claim 1, wherein the trench comprises first and second trenches,
   wherein the sacrificial film pattern comprises first and second sacrificial film patterns disposed in the first and second trenches, respectively,
   wherein the insulating film pattern comprises a first insulating film pattern formed by selectively etching a portion of the insulating film which is formed higher than the first sacrificial film pattern and a second insulating film pattern formed by selectively etching a portion of the insulating film which is formed higher than the second sacrificial film pattern,
   wherein the work function metal pattern comprises first and second work function metal patterns disposed in the first and second trenches, respectively, and
   wherein the method further comprising:
   removing the first work function metal pattern;
   forming a first metal gate structure pattern in the first trench; and
   forming a second metal gate structure pattern on the second work function metal pattern in the second trench.

9. The method of claim 8, wherein the semiconductor substrate comprises a N-type field effect transistor (NFET) region and a P-type field effect transistor (PFET) region.

10. A method of manufacturing a semiconductor device, the method comprising:
    forming an interlayer insulating film on a semiconductor substrate, wherein the interlayer insulating film comprises a trench;
    forming a work function metal layer in the trench;
    forming an insulating film on the work function metal layer;
    forming a sacrificial film on the insulating film, wherein the sacrificial film fills the trench;
    forming a sacrificial film pattern disposed in the trench by etching the sacrificial film;
    forming an insulating film pattern by selectively etching a portion of the insulating film which is formed higher than the sacrificial film pattern;
    forming a work function metal pattern disposed in the trench by selectively etching a portion of the work function metal which is formed higher than the insulating film pattern, wherein forming the interlayer insulating film comprises sequentially forming a gate insulating film and a conductive film in the trench, and forming the work function metal layer in the trench comprises forming the work function metal layer on the conductive film; and
    comprising forming a metal nitride film between the gate insulating film and the conductive film.

11. The method of claim 10, wherein the metal nitride film comprises TiN.

12. A method of manufacturing a semiconductor device, the method comprising:
    forming an interlayer insulating film on a semiconductor substrate, wherein the interlayer insulating film comprises a first trench having a first width and a second trench having a second width different from the first width;
    forming a work function metal layer in the first and second trenches;
    forming an insulating film on the work function metal layer formed in the first and second trenches;
    forming a sacrificial film on the insulating film and filling the first and second trenches;

forming first and second sacrificial film patterns disposed in the first and second trenches, respectively, by etching the sacrificial film;

forming a first insulating film pattern by selectively etching a portion of the insulating film which is formed higher than the first sacrificial film pattern and forming a second insulating film pattern by selectively etching a portion of the insulating film which is formed higher than the second sacrificial film pattern; and forming a first work function metal pattern disposed in the first trench by selectively etching a portion of the work function metal which is formed higher than the first insulating film pattern and forming a second work function metal pattern disposed in the second trench by selectively etching a portion of the work function metal which is formed higher than the second insulating film pattern, wherein a first depth from a top surface of the interlayer insulating film to a top surface of the first work function metal pattern is different from a second depth from the top surface of the interlayer insulating film to a top surface of the second work function metal pattern.

13. The method of claim 12, wherein the first width is smaller than the second width, and the first depth is smaller than the second depth.

14. The method of claim 12, wherein the work function metal layer comprises a metal nitride film, the insulating film comprises an oxide film, and the sacrificial film comprises an organic film.

15. The method of claim 14, wherein the oxide film is used as an etch stop film when the organic film is etched.

* * * * *